United States Patent [19]

Dubujet

[11] Patent Number: 4,939,385
[45] Date of Patent: Jul. 3, 1990

[54] REENERGIZING CIRCUIT FOR A MOS TECHNOLOGY INTEGRATED CIRCUIT

[75] Inventor: Bruno Dubujet, Le Tholonet, France

[73] Assignee: SGS-Thomson Microelectronics SA, Gentilly, France

[21] Appl. No.: 290,141

[22] Filed: Dec. 27, 1988

[30] Foreign Application Priority Data

Dec. 30, 1987 [FR] France ................ 87 18369

[51] Int. Cl.$^5$ ...................... H03K 17/687; H03K 3/01
[52] U.S. Cl. ............................ 307/296.8; 307/296.5; 307/572
[58] Field of Search ............... 307/443, 448, 451, 594, 307/296.5, 296.6, 296.8, 597, 246, 572

[56] References Cited

U.S. PATENT DOCUMENTS 4,797,584  1/1989  Aguti et al. .................... 307/594
4,818,904  4/1989  Kobayashi .................... 307/296.5

FOREIGN PATENT DOCUMENTS 0150480  8/1985  European Pat. Off. .
2549317  1/1985  France .
21042646 2/1983  United Kingdom .

Primary Examiner—Stanley D. Miller
Assistant Examiner—Margaret Rose Wambach
Attorney, Agent, or Firm—Roland Plottel

[57] ABSTRACT

The present invention relates to a reenergizing circuit designed to start a MOS technology integrated circuit. It comprises a power supply terminal, a ground terminal and an output terminal, a first capacitor which is connected between the ground terminal and a circuit node; the capacitor has a charge which is controlled by means of a first p-type transistor which is connected between the power terminal and the circuit node. It further comprises an inverter gate which has a modifiable threshold voltage whose input terminal is connected to the circuit node, an inverter connected between the output terminal of the inverter gate and the output terminal, a current source which is connected in series to a divider circuit controlling the first p-type transistor and a circuit (C) having a transfer function $V_S=f(V_E)$ of the inverter type, said circuit (C) being connected between the output terminal of the inverter gate and the current source in order to control the operation of the current source.

11 Claims, 2 Drawing Sheets

REENERGIZING CIRCUIT FOR A MOS TECHNOLOGY INTEGRATED CIRCUIT

BACKGROUND OF THE INVENTION

The present invention relates to a MOS technology integrated circuit reenergizing circuit (metal, oxide, semiconductor), more particularly to a CMOS (Complementary MOS) technology circuit.

In certain types of integrated circuits, and particularly those containing flip-flops, it is important that certain points of the circuit have a clearly defined logical state when the circuit is energized following a power cut-off. Indeed, it is important to prevent uncertain or incorrect logic states from appearing during the build-up of the power supply voltage and having subsequent effects on the operation of the circuit.

However, the state of the nodes in a logic circuit can only assume a definite value if the power supply voltage of the circuit exceeds a minimum value. As an example, for a logic circuit manufactured according to the C-MOS technology, this minimum value is 3 Volts. For a lower voltage, the node potentials are variable, depending more upon the circuit capacitive coupling than they do upon purely logical data. In addition, these potentials may differ from one circuit to another according to line production.

To overcome this drawback, a reenergizing circuit is thus used supplying a positioning pulse when the power supply voltage reaches a high enough value to permit the positioning of the logic circuit using a no-load operating cycle. To operate correctly, the reenergizing circuits must meet a certain number of criteria. They must be fast in order to operate with power supply rise times included between one microsecond and one second. They must trigger for a voltage greater than 3 Volts but less than 4.5 Volts. In addition, the triggering pulse must reach the circuit before the power supply has become stabilized at its final value. Further, they must be able to operate in a temperature range included between $-55$ C. and $+125$ C.

It is the object of the present invention to provide a new reenergizing circuit which meets the above-defined criteria.

SUMMARY OF THE INVENTION

Thus, the present invention relates to a reenergizing circuit designed to start a MOS technology integrated circuit which comprises:

a terminal to which is applied the power supply voltage, a ground terminal and an output terminal enabling or disabling the supply of the integrated circuit.

a capacitor connected between the ground terminal and a first node of the circuit, the load of which is controlled by a first transistor of the p-type connected between the terminal to which is applied the power supply voltage and the first node of the circuit.

a modifiable threshold inverter gate, the input terminal of which is connected to the second node of the circuit.

an inverter connected between the output terminal of the inverter gate and to the output terminal, a current source connected in series to a divider circuit controlling the first p-type transistor and, a circuit having a transfer function $V_S = f(V_E)$ of the inverter type, said circuit being connected between the output terminal of the inverter gate and the current source in such a way as to control the operation of the current source.

According to a preferred embodiment, the modifiable threshold voltage inverter gate consists of an inverter connected to the ground terminal through a second transistor, the gate of which is connected to the output terminal of the divider circuit.

Further, in accordance with another feature of the present invention, it also comprises a third transistor connected in parallel with the second transistor with the gate of the third transistor connected to the output terminal. The third transistor locks the system when the output S has changed over to a state enabling the energizing of the integrated circuit.

According to an embodiment of the present invention, the divider circuit comprises two diode-connected MOS transistors. Preferably, the two transistors are of the n-type and have different threshold voltages because of their differences of geometry. In addition, the current source comprises a p-type transistor.

In accordance with the present invention, various embodiments can be used to achieve the circuit having a transfer function $V_S = f(V_E)$ of the inverter type. In accordance with a first embodiment, this circuit may consist of a single inverter consisting of, preferably, MOS transistors having different threshold voltages and controlled as a function of the type of transfer function to be obtained.

In accordance with another embodiment, this circuit consists of an inverter including between a fifth p-type transistor and a sixth n-type transistor a diode-connected transistor, the inverter output terminal of which is taken from a node formed between the fifth p-type transistor and the diode-connected transistor. In this case, the circuit has a non-return function so that the output voltage $V_S$ cannot return to zero after initial operation.

According to a preferred embodiment, said circuit having a transfer function of $V_S = f(V_E)$ of the inverter type, consists of a series-set-up between the power supply terminal and the ground terminal of a fifth p-type transistor, a diode-connected transistor and a sixth n-type transistor with the circuit input terminal connected, through a seventh n-type transistor the gate of which is connected to the terminal to which is applied the power supply, to the gate of the fifth p-type transistor and directly to the gate of the sixth n-type transistor, and the output terminal of said circuit being taken at the circuit node formed between the fifth p-type transistor and the diode-connected transistor.

In this case, the transfer curve has different slopes.

In the same way as previously, it also includes a non-return function.

In addition, to correctly position the circuit on starting, it also includes a number of capacitors placed correctly at the different circuit nodes. Preferably, said capacitors consist of MOS p-type transistors whose two main electrodes are short-circuited and whose gate is connected either to the terminal receiving the power supply or to the ground terminal.

Other features and advantages of the present invention will appear from the reading of the description of the different embodiments given below with reference to the drawings attached, in which:

FIG. 1 is a circuit diagram of an embodiment for a reenergizing circuit according to the present invention, FIGS. 2, 3 and 4 are diagrams of the different embodiments of the circuit having a transfer function $V_S = f(V_E)$ of the inverter type, as used in the reenergizing circuit of the present invention, FIG. 5 represents the transfer functions $V_S = f(V_E)$ for the different circuits of FIGS. 2, 3 and 4 and FIG. 6 represents the diagrams of voltage variations as a function of time at different points of the reenergizing circuit.

DETAILED DESCRIPTION OF THE INVENTION

To simplify the description, in the different figures, the same elements will bear the same references.

Figure 1:
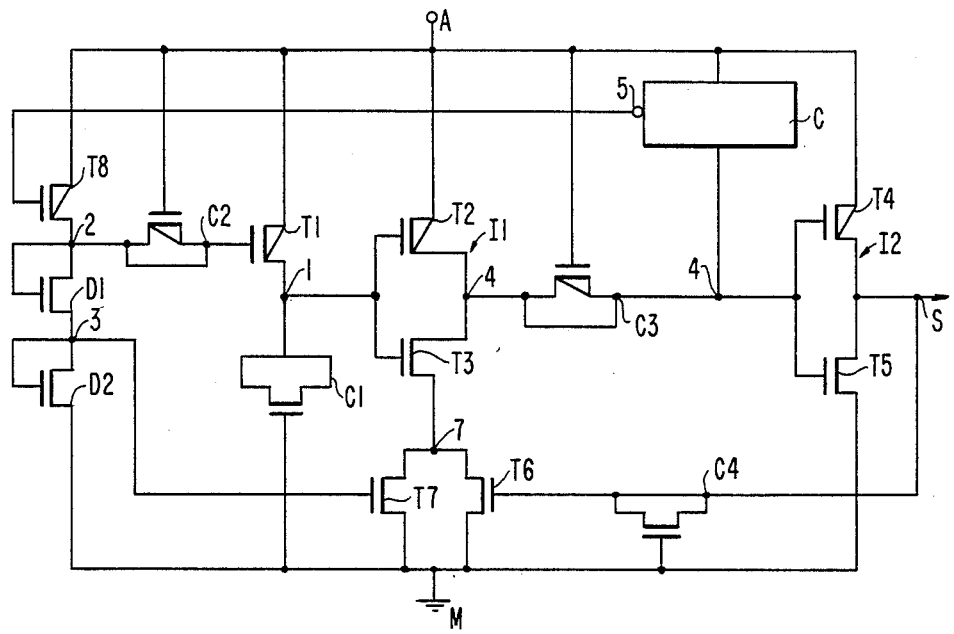

As disclosed by FIG. 1, the reenergizing circuit according to the present invention includes a terminal A which is connected to the external power supply voltage, this terminal A also being connected to all the components normally connected to the power supply voltage, a ground terminal M which is connected to all the components normally connected to ground potential and an output terminal S enabling or disabling the supply of the integrated circuit as a function of the external power supply value. In addition, the circuit includes a capacitor C1 made in the embodiment shown with an n-type MOS transistor whose two main electrodes, i.e. the drain and source, are short-circuited. The gate of capacitor C1 is connected to ground terminal M while the two main short-circuited electrodes are connected to a first node of circuit 1. In addition, the first node of circuit 1 is connected to one of the main electrodes of a first transistor T1 of the p-type whose other main electrode is connected to terminal A. The gate of this transistor T1 is connected to one of the output terminals of a divider circuit via a stabilization capacitor C2, as will be explained below. The capacitor C1 is an essential element in the reenergizing circuit and is irreversibly charged, as will be explained in more detail below.

In addition, the first node of circuit 1 is connected to the input terminal of a modifiable threshold voltage inverter gate. This inverter gate consists essentially of an inverter I1 and a transistor T7. More specifically, the inverter gate includes a p-type transistor T2 one of the main electrodes of which is connected to terminal A, while the other main electrode is connected to one of the main electrodes of an n-type transistor T3. The other main electrode of transistor T3 is connected in series with one of the main electrodes of the p-type transistor T7, the other main electrode of which is connected to terminal M. The gates of transistors T2 and T3 are connected together and also connected to the first node of circuit 1 whilst the output terminal of the inverter gate is provided at the connection of transistors T2 and T3 to form a node circuit 4. In addition, the gate of transistor T7 is connected to an output terminal of the divider circuit forming the node circuit 3.

The circuit according to the present invention also includes an inverter I2 which is connected through a stabilization capacitor C3 to the node 4 forming the output terminal of the inverter gate. This inverter I2 consists of a p-type transistor T4 which is connected in series with an n-type transistor T5 between terminal A and terminal M. The gates of transistors T4 and T5 are connected together and to node 4. In addition, the output terminal of inverter gate I2 forms the output terminal S of the reenergizing circuit. In order to lock the reenergizing circuit, once the pulse enabling the energizing of the integrated circuit has been supplied, the output terminal S is connected via a stabilization capacitor C4 to the gate of an n-type transistor T6. Transistor T6 is connected in parallel to transistor T7. In addition the circuit node 4 is connected to the input terminal of a circuit C having a transfer function of $V_S = f(V_E)$ of the inverter type. Circuit C, to which is applied the power supply voltage, provides an output signal to the current source in order to control the operation of this current source. As shown in FIG. 1, the current source consists of a p-type transistor T8 one of the main electrodes of which is connected to terminal A, the other main electrode being connected to a divider circuit. The gate of transistor T8 is therefore connected to node 5 forming the output terminal of circuit C. The divider circuit used in this invention consists of two n-type MOS transistors D1, D2 connected as diodes. More specifically, transistors D1 and D2 are connected in series with one another and with transistor T8 forming a current source. In addition, the gate of transistor D1 is connected to node 2 of the circuit formed between transistor T8 and D1; the gate of transistor D2 is connected to node 3 of the circuit formed between transistors D1 and D2. The node 2 is connected through a stabilization capacitor C2 to the gate of the first transistor T1 while node 3 is connected directly to the gate of transistor T7. In the embodiment herein described, transistors D1 and D2 are chosen with different threshold voltages by giving them different dimensions so that the threshold voltages of diodes D1 and D2 are different. Further, as represented in FIG. 1, the different stabilization capacitors C2, C3 and C4 consist of n-type or p-type transistors whose main electrodes are short-circuited and whose gate is connected either to terminal A (for p-types) or to terminal M (for n-types) depending upon the stabilization voltage to be obtained.

With reference to the FIGS. 2, 3 and 4, different embodiments which might be used for circuits C will now be described.

Figure 2:
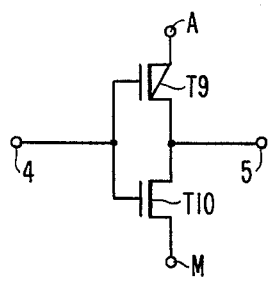
Figure 5:
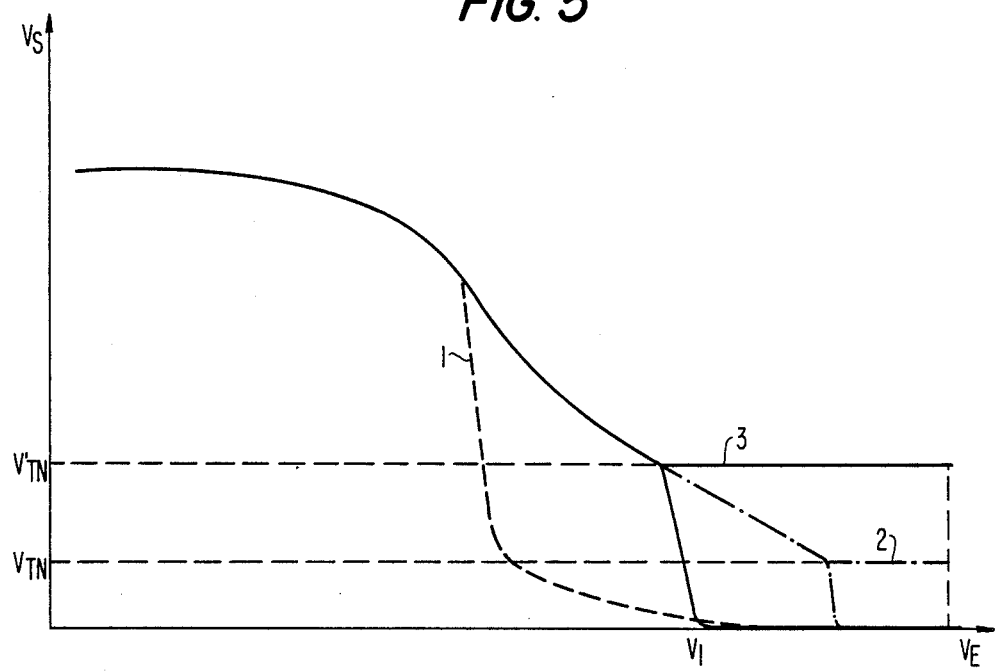

According to a first embodiment shown in FIG. 2, circuit C may consist of a single inverter. In this case, it will include, connected in series between terminal A and terminal M, a p-type transistor T9 and an n-type transistor T10. The gates of the two transistors T9 and T10 will be connected together and to the input node 4. In this case, transfer function $V_S = f(V_E)$ is represented by the curve 1 of FIG. 5. This system has the drawback of a relatively high time constant. In addition, to obtain correct operation, the threshold voltages of transistor T9 and T10 have to be chosen suitably.

Figure 3:
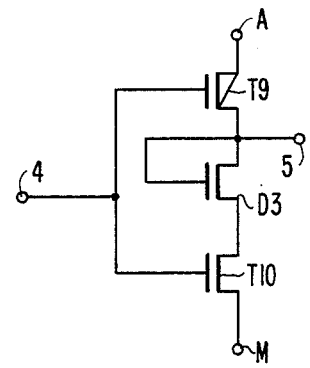

According to another embodiment shown in FIG. 3, a diode-connected transistor T9 is interposed between the p-type transistor T9 and the n-type transistor T10. In this case, the output terminal 5 of the inverter is at the interconnection between transistor T9 and diode D3 forming node 5. With this circuit, the transfer curve is the curve shown with the dots and dashes in FIG. 5. During the first operation, the output voltage changes from 0 to 5 volts, but then, output voltage V6 cannot drop below the n-type transistor conduction threshold. Accordingly, it varies between VTn and 5 volts.

Figure 4:
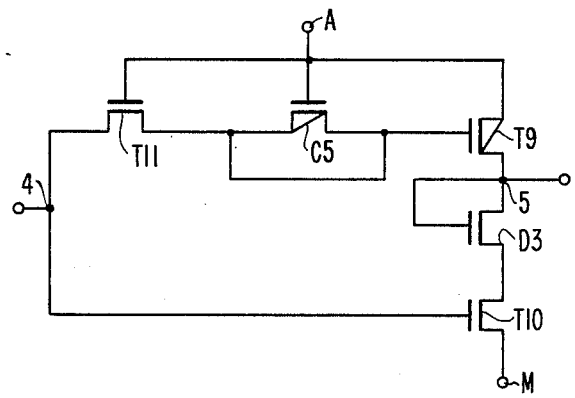

According to a preferred embodiment, circuit C consists of the circuit shown in FIG. 4. In this case, the gate of transistor T9 is connected to input node 4 via a stabilization capacitor C5 which can be omitted and by an n-type transistor T11. Capacitor C5 consists of a p-type transistor whose two main electrodes are short-circuited and whose gate is connected to power supply terminal A. The main electrodes of capacitor C5 are connected to gate T9 and to one of the main electrodes of transistor T11 whose gate is also connected to power supply terminal A. With the circuit of FIG. 4, we obtain a transfer function $V_S = f(V_E)$ represented by curve 3 in FIG. 5. In this case, voltage $V_S$ remains substantially equal to zero until the input voltage has dropped to V1. Then, voltage $V_S$ very rapidly rises to V'Tn subsequently following the transfer curve of the circuit shown in FIG. 3. In the same way as for the system shown in FIG. 3, there is an anti-return function so that the output voltage $V_S$ can no longer vary except between 5 volts and V'Tn. This output voltage, in all cases, is the voltage used to control the voltage source consisting of transistor T8.

The last two circuits have the advantage of a relatively shallow slope $V_S/V_E$ within a certain operating range making the system quasi-linear.

Now, with reference to FIG. 6, the operation of the circuit described in FIG. 6 will be explained in the event of the circuit C being made up of the circuit shown in FIG. 4.

Figure 6:
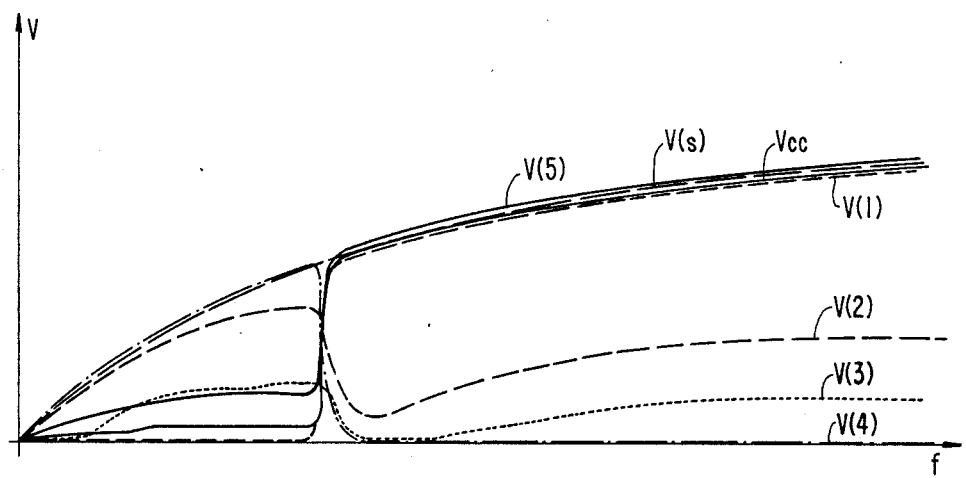

FIG. 6 therefore shows the following curves:

Vcc represents the time-related variation of the external power supply voltage applied to terminal A. It is assumed that this voltage grows exponentially to a value between 4.5 volts and 5 volts at which value it becomes stabilized;

V(1), V(2), V(3), V(4), V(5) and V(S) represent the voltage variations at the various nodes 1, 2, 3, 4, 5 and S of the circuit.

The p channel transistor threshold voltage (in particular T8 and T1) is designated by $VT_p$; the n channel transistor threshold voltage (in particular T3, T10, T11, T7, T6) is designated by $VT_n$.

1. On energizing, node 1 is at zero because capacitor C1 is connected to ground ; node 4 is at Vcc because of capacitor C3 connected to Vcc ; output terminal S is at zero volt; the voltage at gate T9 is at Vcc because of capacitor C5 ; the voltage at node 5 is at Vcc ; transistor T8 does not yet conduct so that the voltage at points 2 and 3 is at zero volt;

2. When Vcc reaches $VT_p$, transistor T8 begins to conduct, current is injected into the diode-connected transistors D1 and D2. The voltage at node 2 increases subsequently following Vcc and the voltage at node 3 begins to increase as soon as the threshold voltage of diode-connected transistor D1 is reached. The voltage at node 3 follows the voltage at node 2 according to the division ratio given by the threshold voltage of the two diode-connected transistors D1 and D2. As soon as the voltage at node 2 reaches the point whereby Vcc $= VT_p + VT_{D1} + VT_{D2}$, T1 conducts and capacitor C1 charges very slowly.

3. When Vcc $VT_p + VT_{D1} + VT_{D2}$, $VT_{D1}$ and $VT_{D2}$ being the diode threshold voltages, the voltage at node 4 drops abruptly as shown in FIG. 6, the voltage at node 5 may increase and turn off transistor T8. Therefore, more current is injected into diodes D1 and D2. The voltage at nodes 2 and 3 therefore drops. Because the voltage at node 4 decreases, the voltage at node 5 at the output terminal of inverter I2 increases and follows voltage Vcc.

In addition, transistor T7 turns off, but transistor T6 conducts. Capacitor C1 continues to be charged following Vcc. Consequently, node 4 is held at zero volt.

Switching is therefore obtained when Vcc $= VT_p + VT_{D1} + VT_{D2}$ which, in the embodiment shown in FIG. 6 is chosen at 3 volts.

With this system, it is possible to obtain switching for a voltage Vcc included between 3 volts and 4.5 volts. In addition, as shown in FIG. 6, switching is very fast.

It is obvious for the person skilled in the art that the circuit of the invention can be modified, in particular by the use of equivalent circuits.

What is claimed is:

1. A power-on reset circuit to start operation of MOS integrated circuit, comprising:
    a power supply terminal for receiving a power supply voltage, a ground terminal, and an output terminal for supplying an output pulse signal upon powering of the integrated circuit;
    a first capacitor which is connected between said ground terminal and a first circuit node, said first capacitor having its charge controlled through a first p-type transistor connected between said power supply terminal and said first circuit node;
    an inverter gate with a modifiable threshold voltage, said inverter gate having an input connected to said first circuit node;
    an inverter circuit connected between an output of said inverter gate and said output terminal;
    a current source connected in series with a divider circuit between said power supply terminal and said ground terminal, said divider connected to a gate of said first p-type transistor;
    and a feedback circuit having an inverting transfer function, said feedback circuit having an input connected to the output of said inverter gate and having an output connected to control operation of said current source.

2. A power-on reset circuit according to claim 1, wherein said inverter gate has a modifiable threshold voltage and comprises an elementary inverter circuit, connected to said ground terminal via a second transistor, said second transistor having a gate connected to said divider circuit.

3. A power-on reset circuit according to claim 2, further comprising a third transistor in parallel with said second transistor, said third transistor having a gate connected to said output terminal.

4. A power-on reset circuit according to claim 1, wherein said divider circuit comprises two transistors connected as diodes.

5. A power-on reset circuit according to claim 1, wherein said current source is a p-type fourth transistor.

6. A power-on reset circuit according to claim 1, wherein said feedback circuit having an inverting transfer function is a simple two-transistor inverter.

7. A power-on reset circuit according to claim 1, wherein said feedback circuit having an inverting transfer function comprises a fifth p-type transistor in series with a sixth n-type transistor, with a diode-connected transistor serially connected between the drains of the fifth and sixth transistors.

8. A power-on reset circuit according to claim 7, comprising a seventh transistor connected between the input of said feedback circuit and the gate of said fifth transistor.

9. A power-on reset circuit according to claim 8, further comprising a capacitor between said gate of the fifth transistor and said power supply terminal.

10. A power-on reset circuit according to claim 1, further comprising a capacitor connected between the gate of said first transistor and the power supply terminal, another capacitor connected between the output of said inverter gate and said power supply terminal, and a capacitor connected between the output terminal and the ground terminal.

11. A power-on reset circuit according to claim 10, wherein said capacitors are transistors having their drain and source connected together.

* * * * *